(12) United States Patent

Zhu

(10) Patent No.: US 12,563,888 B2
(45) Date of Patent: Feb. 24, 2026

(54) DISPLAY DEVICE WITH ENCAPSULATED QUANTUM DOT LIGHT-EMITTING DIODE AND MANUFACTURING METHOD THEREOF

(71) Applicant: TCL TECHNOLOGY GROUP CORPORATION, Huizhou (CN)

(72) Inventor: Pei Zhu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 714 days.

(21) Appl. No.: 17/850,377

(22) Filed: Jun. 27, 2022

(65) Prior Publication Data

US 2022/0328780 A1 Oct. 13, 2022

Related U.S. Application Data

(63) Continuation of application No. PCT/CN2020/139787, filed on Dec. 27, 2020.

(30) Foreign Application Priority Data

Dec. 31, 2019 (CN) .......................... 201911423349.5

(51) Int. Cl.
*H10K 50/17* (2023.01)
*H10K 50/115* (2023.01)
(Continued)

(52) U.S. Cl.
CPC ......... *H10K 50/171* (2023.02); *H10K 50/115* (2023.02); *H10K 50/16* (2023.02);
(Continued)

(58) Field of Classification Search
None
See application file for complete search history.

(56) References Cited

U.S. PATENT DOCUMENTS

2019/0103571 A1 4/2019 Dong et al.
2021/0202911 A1* 7/2021 Kim ..................... H10K 59/874

FOREIGN PATENT DOCUMENTS

CN 101331628 A 12/2008
CN 101391498 A 3/2009
(Continued)

OTHER PUBLICATIONS

International Search Report mailed Mar. 29, 2021, in corresponding International Application No. PCT/CN2020/139787, 6 pages (with English Translation).

(Continued)

*Primary Examiner* — Jesse Y Miyoshi
(74) *Attorney, Agent, or Firm* — Maier & Maier, PLLC

(57) ABSTRACT

An electronic device and a manufacturing method thereof. The electronic device includes a quantum dot light-emitting diode and an encapsulation layer encapsulating the quantum dot light-emitting diode. The quantum dot light-emitting diode includes an anode, a cathode, a quantum dot light-emitting layer provided between the anode and the cathode, an electron transport layer provided between the cathode and the quantum dot light-emitting layer, and a zinc carbide layer provided between the cathode and the electron transport layer. The encapsulation layer includes a gas reservoir layer. Arrangement of a zinc carbide layer between an electron transport layer and a cathode can improve transport capability of a carrier, and cooperation of the zinc carbide layer and an encapsulation layer can enhance a positive aging effect and stability of a device, and extend service life of the device.

10 Claims, 2 Drawing Sheets

(51) Int. Cl.
  *H10K 50/16*   (2023.01)
  *H10K 50/84*   (2023.01)
  *H10K 50/844*   (2023.01)
  *H10K 102/10*   (2023.01)

(52) U.S. Cl.
  CPC ......... *H10K 50/844* (2023.02); *H10K 50/846*
    (2023.02); *H10K 2102/101* (2023.02)

(56) References Cited

FOREIGN PATENT DOCUMENTS

| | | |
|---|---|---|
| CN | 103534021 A | 1/2014 |
| CN | 105140358 A | 12/2015 |
| CN | 105720206 A | 6/2016 |
| CN | 105870347 A | 8/2016 |
| CN | 110364635 A | 10/2019 |

OTHER PUBLICATIONS

First Office Action issued Nov. 17, 2021, in corresponding to Chinese Application No. 2019114233495; 31 pages (with English Translation).

* cited by examiner

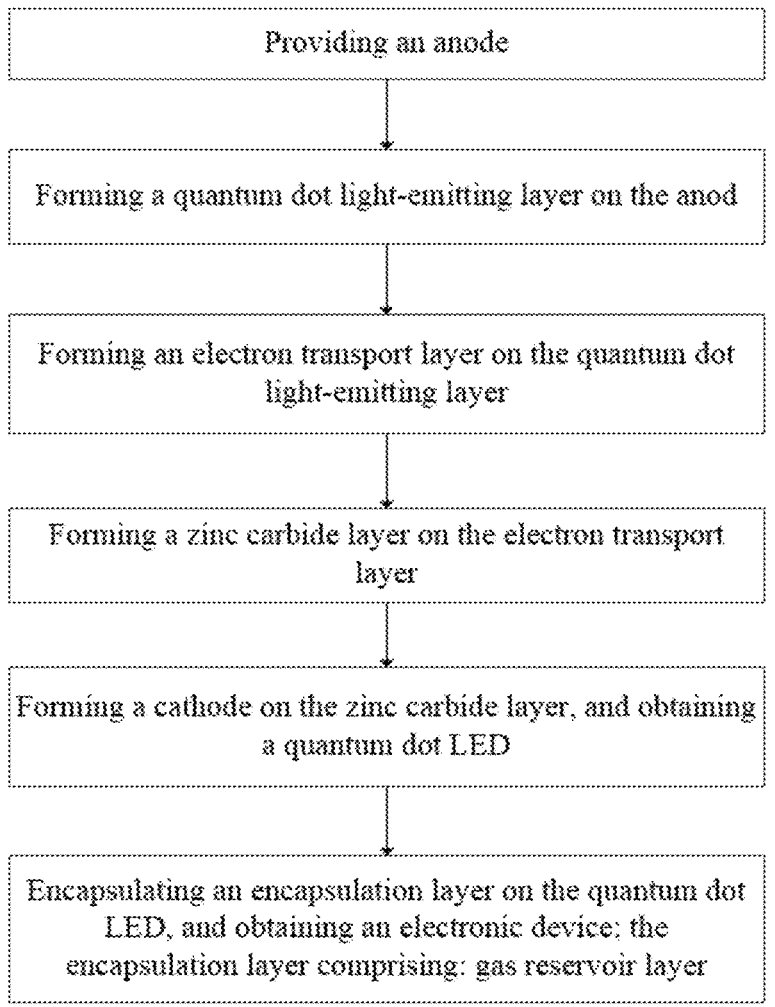

> Providing an anode

> Forming a quantum dot light-emitting layer on the anod

> Forming an electron transport layer on the quantum dot light-emitting layer

> Forming a zinc carbide layer on the electron transport layer

> Forming a cathode on the zinc carbide layer, and obtaining a quantum dot LED

> Encapsulating an encapsulation layer on the quantum dot LED, and obtaining an electronic device; the encapsulation layer comprising: gas reservoir layer

FIG. 2

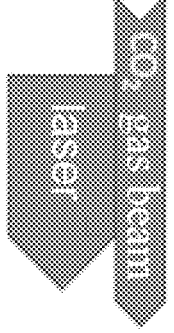

zinc oxide film

FIG. 3

DISPLAY DEVICE WITH ENCAPSULATED QUANTUM DOT LIGHT-EMITTING DIODE AND MANUFACTURING METHOD THEREOF

CROSS-REFERENCES TO RELATED APPLICATIONS

The present application is a national stage application of PCT Patent Application No. PCT/CN2020/139787, filed on Dec. 27, 2020, which claims priority to Chinese Patent Application No. 201911423349.5, filed on Dec. 31, 2019, the content of all of which is incorporated herein by reference.

FIELD

The present application relates to the technical field of devices, in particular to an electronic device and a manufacturing method thereof.

BACKGROUND

In recent years, following a rapid development of a display technology, a quantum dot light-emitting diode (QLED) taking a semiconductor quantum dot material as a light-emitting layer has been widely concerned. A plurality of good characters thereof including a high color purity, a high luminous efficiency, an adjustable light-emitting color, a stable device stability and more, has brought the quantum dot light-emitting diode a wide application prospect in a plurality of fields including a flat panel display, a solid state lighting and more.

A traditional packaging technology for a photoelectric device is accomplished in a glove box with a water and oxygen content less than 1 ppm. A manufactured device is transmitted into the glove box by a linear manipulator in the glove box. A rear cover plate completes coating a UV glue through an automatic gluing machine having an adjusted program, aligning and sticking a photoelectric device substrate having been manufactured with the rear cover plate having the UV glue coated, before forming a wall barrier separated from an atmospheric environment after an UV exposure, the wall barrier can prevent effectively water or oxygen in the air from entering the photoelectric device, to avoid a reaction in between. A defect of a traditional rear cover type packaging method is: easy to have a warping deformation happen (for a metal rear cover), easy to generate a micro crack and an expansion (for a metal rear cover), and easy to crash (for a glass rear cover). The traditional packaging technology requires to be bonded with UV glue in a periphery, and after the UV glue is cured, it becomes loosen and full of holes, both water vapor and oxygen are relatively easy to pass through. And a built-in absorbent will expend after absorbing water, causing a device easy to get deformed, thus causing the device get a further damage.

Currently, a packaging technology for a commercial photoelectric device is developing from a traditional cover plate type packaging to a novel thin film integrated packaging. An appearance of a thin film packaging enables a dream on a flexible display to be realized; however, at a present stage, both a packaging life and a stability thereof are still waiting for a further improvement, having a cost advantage not significant either, and compared with a traditional packaging technology, an advantage thereof is not significant enough. Further, the inventor has found that, an interface between a ZnO electron transport layer and an electrode, with a prolonged usage time, will have a plurality of defects increasing at the interface, making an electron injection potential barrier increase, further affecting a service life of the device.

Therefore, the current technology needs to be improved and developed.

SUMMARY

According to the defects in the prior art described above, the present application provides an electronic device and a manufacturing method thereof, to solve a problem in the prior art that, the service life of the device in the prior art is relatively short.

The technical solution of the present application to solve the technical problems is as follows:

An electronic device, comprising a quantum dot light-emitting diode and an encapsulation layer encapsulating the quantum dot light-emitting diode, wherein:

the quantum dot light-emitting diode comprising: an anode, a cathode, a quantum dot light-emitting layer arranged between the anode and the cathode, an electron transport layer arranged between the cathode and the quantum dot light-emitting layer; further comprising: a zinc carbide layer arranged between the cathode and the electron transport layer;

the encapsulation layer comprising: a gas reservoir layer.

A manufacturing method for an electronic device, wherein comprising a plurality of steps:

providing an anode forming a quantum dot light-emitting layer on the anode;

forming an electron transport layer on the quantum dot light-emitting layer;

forming a zinc carbide layer on the electron transport layer;

forming a cathode on the zinc carbide layer, and obtaining a quantum dot light-emitting diode;

encapsulating an encapsulation layer on the quantum dot light-emitting diode, and obtaining the electronic device;

wherein the encapsulation layer comprising: a gas reservoir layer.

Benefits: the present application, by introducing the zinc carbide layer between the electron transport layer and the cathode, is able to improve a conductivity of the electron transport layer. At a same time, arranging a gas reservoir layer in the encapsulation layer, which is able to absorb hydrogen in addition to the water and the oxygen, and the oxygen being absorbed diffuses into an interface of the zinc carbide and forms the zinc carbonate, while the zinc carbonate is a material having a small conduction band, and the small conduction band facilitates an electron injection, thus following a prolonged placement period of a device, a positive aging effect is achieved. The present application arranges a zinc carbide layer and a hydrogen reservoir layer between the electron transport layer and the cathode, serving as a structure in the encapsulation layer of the device, on a premise of improving a transport capacity of a carrier, by applying in conjunction with the encapsulation layer, it is able to improve a forward aging effect of the device, thereby improve a life and a stability of the device.

BRIEF DESCRIPTION OF THE DRAWINGS

FIG. 2 illustrates a flow chart on a manufacturing method for an electronic device provided by an embodiment of the present application;

FIG. 3 illustrates a schematic diagram on treating a zinc oxide thin film by a laser carbonization method in FIG. 2.

DETAILED DESCRIPTION OF EMBODIMENTS

Figure 1:
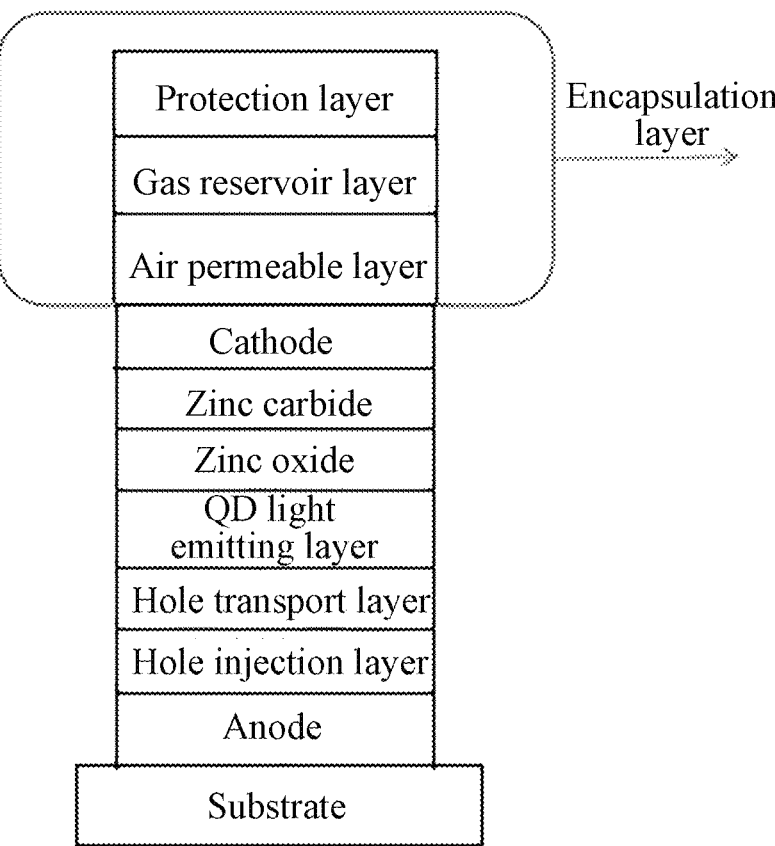
FIG. 1 illustrates a schematic structural diagram on an electronic device provided by an embodiment of the present application.

The present application provides an electronic device and a manufacturing method thereof, in order to make the purpose, technical solution and the advantages of the present application clearer and more explicit, further detailed descriptions of the present application are stated herein, referencing to the attached drawings and some embodiments of the present application. It should be understood that the detailed embodiments of the application described here are used to explain the present application only, instead of limiting the present application.

An embodiment of the present application provides an electronic device, comprising a quantum dot light-emitting diode and an encapsulation layer encapsulating the quantum dot light-emitting diode, wherein:

the quantum dot light-emitting diode comprising: an anode, a cathode, a quantum dot light-emitting layer arranged between the anode and the cathode, an electron transport layer arranged between the cathode and the quantum dot light-emitting layer; further comprising: a zinc carbide layer arranged between the cathode and the electron transport layer;

the encapsulation layer comprising: a gas reservoir layer.

The present application, by introducing the zinc carbide layer between the electron transport layer and the cathode, is able to improve a conductivity of the electron transport layer. Also arranges a gas reservoir layer in the encapsulation layer, which is able to absorb hydrogen in addition to the water and the oxygen, and the oxygen being absorbed diffuses into an interface of the zinc carbide and forms the zinc carbonate, while the zinc carbonate is a material having a small conduction band, and the small conduction band facilitates an electron injection, thus following a prolonged placement period of a device, a positive aging effect is achieved. The present application arranges a zinc carbide layer and a hydrogen reservoir layer between the electron transport layer and the cathode, serving as a structure in the encapsulation layer of the device, on a premise of improving a transport capacity of a carrier, by applying in conjunction with the encapsulation layer, it is able to improve a forward aging effect of the device, thereby improve a life and a stability of the device.

In an embodiment, the encapsulation layer encapsulates an interface between the quantum dot light-emitting diode and air.

In an embodiment, the electron transport layer is a zinc oxide layer. By introducing the zinc carbide layer between the zinc oxide layer and the cathode, it is able to improve a conductivity of the electron transport layer; at a same time, arranging a gas reservoir layer in the encapsulation layer, which is able to absorb hydrogen in addition to the water and the oxygen, and the oxygen being absorbed diffuses into the interface of the zinc carbide and forms the zinc carbonate, while the zinc carbonate is a material having a small conduction band, and the small conduction band facilitates an injection of electron. In addition, the zinc carbonate can fill the defects at the interface between the zinc oxide and the electrode, so as to prevent the defects at the interface from capturing electrons, thereby increasing the injection of electrons, and having a positive aging effect following a prolongation of the device placement period.

In an embodiment, the encapsulation layer further comprises: an air permeable layer, the gas reservoir layer is formed on the air permeable layer, and the air permeable layer is arranged on a side close to the cathode. A hydrogen absorbed by the gas reservoir layer penetrates the air permeable layer and diffuses into the interface of the zinc carbide, before forming the zinc carbonate.

In an embodiment, the encapsulation layer further comprises: a protection layer, the protection layer is formed on the gas reservoir layer, and the protection layer is arranged on a side away from the cathode. The protection layer is applied to preventing the gas reservoir layer from being oxidized when in contact with air.

The encapsulation layer of the present embodiment, wherein the air permeable layer is permeable to $H_2$, so that $H_2$ is able to enter an interface of the electron transport layer through the encapsulation layer. The gas reservoir layer is applied to absorbing gas, and mainly absorbing hydrogen, while at a same time, playing a role of isolating the water and oxygen from the device. A principle of the gas reservoir layer absorbing gas is, the gas reservoir layer is in a metal active state, when a gas molecule collides with the gas reservoir layer, a physical adsorption will occur, while another part of the gas molecules and the material of the gas reservoir layer will have an electrons interexchange and transfer, and the gas molecules will be decomposed into a plurality of atoms, before diffusing into an inside of a film layer. The protection layer is applied to preventing the gas reservoir layer from being oxidized when in contact with the air.

The encapsulation layer of the present embodiment, wherein a multi-layer film forms a good covering stair, reducing a defect of a film layer, being able to better prevent the water and oxygen from penetrating to the quantum dot light-emitting diode; at a same time, by the encapsulation layer allows selectively the oxygen to penetrate the quantum dot light-emitting diodes, the oxygen is able to reach the interface of the zinc carbide layer and react with the zinc carbide to form the zinc carbonate. The zine carbonate is able to repair the defects at the interface between the electron transport layer and the electrode, which is conducive for the electrons to perform an injection and transmission, so that the efficiency and the life of the quantum dot light-emitting diode will get improved significantly, following an extension of the placement period of the quantum dot light-emitting diode; in addition, compared with a traditional cover plate packaging, the packaging layer has a plurality of characteristics of lightness, thinness, high efficiency, and more, as well as overcoming a character of being fragile for a glass. Thus, a lifespan of the quantum dot light-emitting diode has been improved.

In an embodiment, the air permeable layer comprises Pd or a Pd alloy. Selecting Pd as a material of the air permeable layer is mainly due to a strong permeability for $H_2$ of the Pd. Selecting the Pd alloy is able to increase a lattice spacing, thereby further enhancing the permeability for $H_2$. Further, the air permeable layer is Pd or Pd alloy.

Further in an embodiment, the Pd alloy comprises one or more of a Pd—Sn alloy, a Pd—Au alloy, a Pd—B alloy, and more.

In an embodiment, a thickness of the air permeable layer is 30-150 nm. An excessive thickness slows down a rate of permeation for the hydrogen and consumes more expensive palladium.

In an embodiment, the gas reservoir layer comprises a transition metal in a main group VIII or an alloy thereof. The transition metals in the main group VIII comprise one or more of Ti, Zr, Hf, and more. The alloys of the transition metal in the main group VIII comprise one or more of Ti—Zr—V alloys, Zr—V—Fe alloys, and more. Further, the gas reservoir layer is a transition metal in the main group VIII or an alloy thereof.

In an embodiment, a thickness of the gas reservoir layer is 30-150 nm.

In an embodiment, the protection layer comprises an inorganic oxide, including a silicon dioxide layer, a titanium oxide layer. Further, the protection layer is an inorganic oxide.

In an embodiment, a thickness of the protection layer is 100-200 nm.

In the present embodiment, the quantum dot light-emitting diode has a plurality of forms, and the present embodiment takes mainly the quantum dot light-emitting diode shown in FIG. 1 as an example for a detailed description. In an embodiment, shown as FIG. 1, the quantum dot light-emitting diode comprises, stacked from bottom up, a substrate, an anode, a hole injection layer, a hole transport layer, a quantum dot light-emitting layer, a zinc oxide layer, a zinc carbide layer and a cathode. The quantum dot light-emitting diode has the encapsulation layer described in the present embodiment arranged, and the encapsulation layer comprises: an air permeable layer, a gas reservoir layer formed on the air permeable layer, and a protection layer formed on the gas reservoir layer; the air permeable layer and the cathode are arranged in a fit.

In an embodiment, a thickness of the electron transport layer (a sum of both thicknesses of the zinc oxide layer and the zinc carbide layer) is about 50-150 nm.

In an embodiment, the substrate may be a substrate made of a rigid material, including glass and more, or a substrate made of a flexible material, including one of PET or PI or more.

In an embodiment, the anode may be selected from one or more of indium-doped tin oxide (ITO), fluorine-doped tin oxide (FTO), antimony-doped tin oxide (ATO), aluminum-doped zinc oxide (AZO), and more. A thickness of the anode may be 50-150 nm.

In an embodiment, a material of the hole injection layer is a material with a good hole injection performance, in one embodiment, comprising but not limited to, one or more of poly(3,4-ethylenedioxythiophene)-polystyrenesulfonic acid (PEDOT: PSS), copper phthalocyanine (CuPc), 2,3,5,6-tetrafluoro-7,7',8,8'-tetracyanoquinone-dimethane (F4-TCNQ), 2,3,6,7,10,11-hexacyano-1,4,5,8,9,12-hexaazatriphenylene (HATCN), a transition metal oxide, a transition metal chalcogenide; wherein, the transition metal oxide may comprise but not limited to, one or more of $NiO_x$, $MoO_x$, $WO_x$, $CrO_x$ and $CuO$; the transition metal chalcogenide may comprise but not limited to, one or more of $MoS_x$, $MoSe_x$, $WS_x$, $WSe_x$ and $CuS$. A thickness of the hole injection layer is 30-150 nm.

In an embodiment, a material of the hole transport layer is an organic material having a good hole transport capability, comprises but not limited to, poly(9,9-dioctylfluorene-CO—N-(4-Butylphenyl)diphenylamine) (TFB), polyvinylcarbazole (PVK), poly(N,N' bis(4-butylphenyl)-N,N'-bis(phenyl)benzidine) (Poly-TPD), poly(9,9-dioctylfluorene-co-bis-N,N-phenyl-1,4-phenylenediamine) (PFB), 4,4',4"-tri(Carbazol-9-yl)triphenylamine (TCTA), 4,4'-bis(9-carbazole) biphenyl (CBP), N,N'-diphenyl-N,N'-bis(3-methyl)phenyl)-1,1'-biphenyl-4,4'-diamine (TPD), N,N'- diphenyl-N,N'-(1-naphthyl)-1,l'-One or more of biphenyl-4, 4'-diamine (NPB), graphene and C60.

In an embodiment, the material of the hole transport layer may also be one or more of an inorganic material having the hole transport capability, including but not limited to, NiOx, MoOx, WOx, CrOx, CuO, MoSx, MoSex, WSx, WSex and CuS.

In an embodiment, a thickness of the hole transport layer is 30-150 nm.

In an embodiment, a material of the quantum dot light-emitting layer may be an oil-soluble quantum dot, and the oil-soluble quantum dot comprises one or more of a quantum dot in a binary phase, a ternary phase, a quaternary phase, and more. Wherein the quantum dot in the binary phase comprises one or more of CdS, CdSe, CdTe, InP, AgS, PbS, PbSe, HgS, and more, the quantum dot in the ternary phase comprises one or more of ZnCdS, CuInS, ZnCdSe, ZnSeS, ZnCdTe, PbSeS, and more, the quantum dot in the quaternary phase comprises one or more of ZnCdS/ZnSe, CuInS/ZnS, ZnCdSe/ZnS, CuInSeS, ZnCdTe/ZnS, PbSeS/ZnS, and more. A material of the quantum dot light-emitting layer can be any one of a red, green or blue quantum dot commonly seen or another yellow light quantum dot, the quantum dot may be cadmium-containing or cadmium-free, and the quantum dot may also be a core-shell quantum dot or a graded shell-based quantum dot. The quantum dot light-emitting layer made of the material has a plurality of characteristics including a wide excitation spectrum and a continuous distribution, as well as a high stability of an emission spectrum, and more. In the present embodiment, a thickness of the quantum dot light-emitting layer is about 30-60 nm.

In an embodiment, the cathode may be selected from one of an aluminum (Al) electrode, a silver (Ag) electrode, and a gold (Au) electrode, and more, may also be selected from one of a nano-aluminum wire, a nano-silver wire, a nano-gold wire, and more. A thickness of the cathode may be 20-100 nm.

An embodiment of the present application provides a manufacturing method for an electronic device, shown as FIG. 2, wherein comprising a plurality of steps:

providing an anode forming a quantum dot light-emitting layer on the anode;

forming an electron transport layer on the quantum dot light-emitting layer;

forming a zinc carbide layer on the electron transport layer;

forming a cathode on the zinc carbide layer, and obtaining a quantum dot light-emitting diode;

encapsulating an encapsulation layer on the quantum dot light-emitting diode, and obtaining the electronic device;

wherein the encapsulation layer comprising: a gas reservoir layer.

In an embodiment, the encapsulation layer is encapsulated on an interface between the quantum dot light-emitting diode and the air.

In an embodiment, the electron transport layer is a zinc oxide layer. By introducing a zinc carbide layer between the zinc oxide layer and the cathode, a conductivity of the electron transport layer can be improved; at a same time, arranging a gas reservoir layer in the encapsulation layer, which can absorb hydrogen in addition to the water and oxygen (the hydrogen may be that in an environment where the electronic device is used, such as hydrogen in the atmosphere), while the oxygen being absorbed diffuses into the interface of the zinc carbide to form the zinc carbonate, which is a substance having a small conduction band, and the small conduction band benefits an electron injection. In addition, the zinc carbonate can fill a plurality of defects at the interface between the zinc oxide and the electrode, so as to prevent the defects at the interface from capturing the electrons, thereby increasing the electron injection, thus with an extension of a device placement period, it has a positive aging effect.

In an embodiment, the encapsulation layer further comprises: an air permeable layer, the gas reservoir layer is formed on the air permeable layer, and the air permeable layer is arranged on a side close to the cathode. The oxygen absorbed by the gas reservoir layer penetrates the air permeable layer and diffuses into the interface of the zinc carbide before forming the zinc carbonate.

In an embodiment, the encapsulation layer further comprises: a protection layer, the protection layer is formed on the gas reservoir layer, and the protection layer is arranged on a side away from the cathode. The protection layer is applied to preventing the gas reservoir layer from being oxide due to contacting the air.

In an embodiment, adopting a laser gas carbonization method to form the zinc carbide layer on the electron transport layer.

Further in an embodiment, a process of adopting the laser gas carbonization method to form the zinc carbide layer on the electron transport layer comprising: placing a substrate prepared with the electron transport layer under a laser, then both a focused laser beam and an activated $CO_2$ gas beam radiate to a surface of the zinc oxide layer (a zinc oxide film) simultaneously, wherein a preheated temperature of the carbon dioxide is 200-400° C., a power density of the laser is $(0.56\text{-}5.5)*10^5$ W/cm$^2$, a light spot diameter is 1-3 mm, a wavelength of the laser is 10.6 microns, a scanning speed of the laser is 100-300 m/min, shown as FIG. 3. Both the focused laser beam and the activated $CO_2$ gas beam radiate to the surface of the zinc oxide layer simultaneously, ensuring the $CO_2$ gas beam to combine with a melt of the zinc oxide before forming the zinc carbide layer on the electron transport layer.

In the present embodiment, a preparation of other functional layers in the quantum dot light-emitting diode is in the prior art, thus no more details on the preparation process thereof will be repeated herein.

In an embodiment, a preparation method of the encapsulation layer comprises:

adopting a method of magnetron sputtering to form the air permeable layer;

adopting a method of magnetron sputtering to form the gas reservoir layer on the air permeable layer;

adopting a method of magnetron sputtering to form the protection layer on the gas reservoir layer.

In an embodiment, a plurality of steps in adopting the method of magnetron sputtering to form the air permeable layer comprises: firstly preparing a target of Pd or Pd alloy, and adopting a DC magnetron sputtering to prepare a film, with a sputtering power of 60-120 W, a deposition pressure of 4-8 Pa, and a deposition period of 30-100 min.

In an embodiment, a plurality of steps in adopting the method of magnetron sputtering to form the gas reservoir layer comprises: firstly preparing a target of a related alloy, and adopting a DC magnetron sputtering to prepare a film, with a sputtering power of 80-150 W, a deposition pressure of 6-10 Pa, and a deposition period of 50-150 min.

In an embodiment, a plurality of steps in adopting the method of magnetron sputtering to form the protection layer comprises: adopting the method of magnetron sputtering to sputter a related target, with a sputtering air pressure of 1-1.5 Pa, a sputtering power of 80-300 W, and a sputtering thickness of 100-200 nm.

The present embodiment, by the method described above, enables the multi-layer film to form a good covering stair, reducing the defect of the film layer, being able to better prevent the water and oxygen from penetrating to the quantum dot light-emitting diode; at a same time, by the encapsulation layer allows selectively the oxygen to penetrate the quantum dot light-emitting diodes, the oxygen is able to reach the interface of the zinc carbide layer and react with the zinc carbide to form the zinc carbonate. The zinc carbonate is able to repair the defects at the interface between the electron transport layer and the electrode, which is conducive for the electrons to perform the injection and transmission, so that the efficiency and the life of the quantum dot light-emitting diode will get improved significantly, following the extension of the placement period of the quantum dot light-emitting diode; in addition, compared with the traditional cover plate packaging, the packaging method has a plurality of characteristics of lightness, thinness, high efficiency, and more, as well as overcoming the character of being fragile for the glass. Thus, the lifespan of the quantum dot light-emitting diode has been improved.

Further descriptions on the present application are stated by a plurality of embodiments hereafter.

Embodiment 1

The present embodiment provides an electronic device, the electronic device comprises a substrate, a quantum dot light-emitting diode bonded on the substrate, and an encapsulation layer applied to encapsulating the quantum dot light-emitting diode. A structure of the electronic device is, from bottom up: an ITO substrate (50 nm)/a PEDOT: PSS (50 nm)/a poly-TPD (30 nm)/a quantum dot light-emitting layer (20 nm)/a zinc oxide-zinc carbide (30 nm)/silver (70 nm)/an encapsulation Layer (300 nm) in a sequence.

Spin-coating a zinc oxide solution on a device having the quantum dot light-emitting layer prepared to form a film. A speed for the spin-coating is 3000 rad/s, then drying out in a vacuum at 80° C. with a film thickness of 40 nm. Placing the device having a zinc oxide film prepared under a laser, a preheating temperature of the carbon dioxide is 200° C., a power density of the laser is $3.5*10^5$ W/cm$^2$, a light spot diameter is 3 mm, a wavelength of the laser is 10.6 microns, and a scanning speed of the laser is 100 m/min.

A preparation method for a first layer of the encapsulation layer of the device is preparing a Pd—Au alloy target first, and adopting a DC magnetron sputtering method to prepare the film, with a deposition pressure is 5 Pa, a sputtering power is 80 W, a deposition period is 60 min, and a deposition thickness is 80 nm.

A second layer is a getter film, a preparation method is also preparing a Zr—Co—Ce alloy target first, and also adopting the DC magnetron sputtering method to prepare the film, with a sputtering power 100 W, a deposition pressure 8 Pa, a deposition period 100 min, and a deposition thickness 120 nm.

A third layer is a silicon dioxide film, adopting a frequency magnetron sputtering method to prepare a silicon dioxide target, with a sputtering air pressure 1.5 Pa, a sputtering power 200 W, a sputtering period 60 min, and a sputtering thickness 200 nm.

Embodiment 2

The present embodiment provides an electronic device, the electronic device comprises a substrate, a quantum dot light-emitting diode bonded on the substrate, and an encapsulation layer applied to encapsulating the quantum dot light-emitting diode. A structure of the electronic device is, from bottom up: an ITO substrate (50 nm)/a Ag (15 nm)/a PEDOT: PSS (50 nm)/a poly-TPD (30 nm)/a quantum dot light-emitting layer (20 nm)/a zinc oxide-zinc carbide (30 nm)/silver (70 nm)/an encapsulation Layer (300 nm) in a sequence.

Spin-coating a zinc oxide solution on a device having the quantum dot light-emitting layer prepared to form a film. A speed for the spin-coating is 3000 rad/s, then drying out in a vacuum at 80° C. with a film thickness of 40 nm. Placing the device having a zinc oxide film prepared under a laser, a preheating temperature of the carbon dioxide is 200° C., a power density of the laser is $3.5*10^5$ W/cm$^2$, a light spot diameter is 3 mm, a wavelength of the laser is 10.6 microns, and a scanning speed of the laser is 100 m/min.

A preparation method for a first layer of the encapsulation layer of the device is preparing a Pd—Ag alloy target first, and adopting a DC magnetron sputtering method to prepare the film, with a deposition pressure is 5 Pa, a sputtering power is 80 W, a deposition period is 20 min, and a deposition thickness is 30 nm.

A second layer is a getter film, a preparation method is also preparing a Ti—Zr—V alloy target first, and also adopting the DC magnetron sputtering method to prepare the film, with a sputtering power 100 W, a deposition pressure 8 Pa, a deposition period 30 min, and a deposition thickness 30 nm.

A third layer is a silicon dioxide film, adopting a frequency magnetron sputtering method to prepare a silicon dioxide target, with a sputtering air pressure 1.5 Pa, a sputtering power 200 W, a sputtering period 30 min, and a sputtering thickness 100 nm.

Embodiment 3

The present embodiment provides an electronic device, the electronic device comprises a substrate, a quantum dot light-emitting diode bonded on the substrate, and an encapsulation layer applied to encapsulating the quantum dot light-emitting diode. A structure of the electronic device is, from bottom up: an ITO substrate (50 nm)/a Ag (15 nm)/a PEDOT: PSS (50 nm)/a poly-TPD (30 nm)/a quantum dot light-emitting layer (20 nm)/a zinc oxide-zinc carbide (30 nm)/silver (70 nm)/an encapsulation Layer (160 nm) in a sequence.

Spin-coating a zinc oxide solution on a device having the quantum dot light-emitting layer prepared to form a film. A speed for the spin-coating is 3000 rad/s, then drying out in a vacuum at 80° C. with a film thickness of 40 nm. Placing the device having a zinc oxide film prepared under a laser, a preheating temperature of the carbon dioxide is 200° C., a power density of the laser is $3.5*10^5$ W/cm$^2$, a light spot diameter is 3 mm, a wavelength of the laser is 10.6 microns, and a scanning speed of the laser is 100 m/min.

A preparation method for a first layer of the encapsulation layer of the device is preparing a Pd—Ag alloy target first, and adopting a DC magnetron sputtering method to prepare the film, with a deposition pressure is 5 Pa, a sputtering power is 80 W, a deposition period is 20 min, and a deposition thickness is 30 nm.

A second layer is a getter film, a preparation method is also preparing a Zr—V—Fe alloy target first, and also adopting the DC magnetron sputtering method to prepare the film, with a sputtering power 100 W, a deposition pressure 8 Pa, a deposition period 30 min, and a deposition thickness 30 nm.

A third layer is a silicon dioxide film, adopting a frequency magnetron sputtering method to prepare a silicon dioxide target, with a sputtering air pressure 1.5 Pa, a sputtering power 200 W, a sputtering period 30 min, and a sputtering thickness 100 nm.

All above, the present application provides an electronic device and a manufacturing method thereof. The present application, by introducing a zinc carbide layer between the electron transport layer and the cathode, and cooperating with a novel thin film encapsulation layer, reduces the electron transport barrier and improves the positive aging capability of the device, so as to improve the efficiency and the life of the device.

It should be understood that, the application of the present application is not limited to the above examples listed. Ordinary technical personnel in this field can improve or change the applications according to the above descriptions, all of these improvements and transforms should belong to the scope of protection in the appended claims of the present application.

What is claimed is:

1. An electronic device, comprising: a quantum dot light-emitting diode and an encapsulation layer encapsulating on the quantum dot light-emitting diode, wherein:

the quantum dot light-emitting diode comprises: an anode, a cathode, a quantum dot light-emitting layer arranged between the anode and the cathode, an electron transport layer arranged between the cathode and the quantum dot light-emitting layer, and further comprising a zinc carbide layer arranged between the cathode and the electron transport layer; and the encapsulation layer comprises a gas reservoir layer.

2. The electronic device according to claim 1, wherein the encapsulation layer encapsulates an interface between the quantum dot light-emitting diode and air.

3. The electronic device according to claim 1, wherein the encapsulation layer further comprises: an air permeable layer, the gas reservoir layer is formed on the air permeable layer, and the air permeable layer is arranged on a side close to the cathode.

4. The electronic device according to claim 1, wherein the encapsulation layer further comprises: a protection layer formed on the gas reservoir layer, and the protection layer is arranged on a side away from the cathode.

5. The electronic device according to claim 3, wherein the air permeable layer comprises Pd or Pd alloy.

6. The electronic device according to claim 5, wherein the air permeable layer is Pd or Pd alloy.

7. The electronic device according to claim 6, wherein the Pd alloy is selected from the group consisting of a Pd—Sn alloy, a Pd—Au alloy, and a Pd—B alloy; and/or a thickness of the air permeable layer is 30-150 nm.

8. The electronic device according to claim 4, wherein the protection layer comprises an inorganic oxide; and/or a thickness of the protection layer is 100-200 nm; and/or the protection layer is selecting from the group consisting of a silicon dioxide layer and a titanium oxide layer.

9. The electronic device according to claim 8, wherein the protection layer is an inorganic oxide.

10. The electronic device according to claim 1, wherein the electron transport layer is a zinc oxide layer.

* * * * *